United States Patent [19]

Yatsuzuka et al.

[11] Patent Number: 5,128,625
[45] Date of Patent: Jul. 7, 1992

[54] ADAPTIVE PHASE LOCK LOOP SYSTEM

[75] Inventors: Yohtaro Yatsuzuka, Kanagawa; Takuro Muratani, Chiba, both of Japan

[73] Assignee: Kokusai Denshin Denwa Co., Ltd., Tokyo, Japan

[21] Appl. No.: 581,820

[22] Filed: Sep. 12, 1990

[30] Foreign Application Priority Data

Feb. 14, 1990 [JP] Japan .................................. 2-31444

[51] Int. Cl.[5] .............................................. H03L 7/12
[52] U.S. Cl. ...................................... 328/155; 328/14
[58] Field of Search ............... 328/155; 307/511, 516, 307/527; 455/260, 265; 375/97; 331/25

[56] References Cited

U.S. PATENT DOCUMENTS

| | | | |
|---|---|---|---|
| 4,461,014 | 7/1984 | Fujino | 328/155 |
| 4,759,079 | 7/1988 | Ichikawa | 455/265 |
| 4,920,320 | 4/1990 | Matthews | 328/155 |
| 4,926,499 | 5/1990 | Kobayashi et al. | 375/97 |

OTHER PUBLICATIONS

"An Adaptive Phase Lock Loop", by Yatsuzuka, JP Electronics, Information, and Communication Institute Conference 1989, Published on Sep. 15, 1989.

Primary Examiner—Stanley D. Miller
Assistant Examiner—Sinh N. Tran
Attorney, Agent, or Firm—Armstrong, Nikaido, Marmelstein, Kubovcik & Murray

[57] ABSTRACT

A phase lock loop for a digital input signal has a phase detector, a loop filter, a digital voltage controlled oscillator (VCO), an initial phase difference calculator, a center frequency difference calculator and an input buffer memory. In an initial training mode prepared in the PLL operation, an optimum initial phase and an optimum center frequency of the VCO to complete a lock-in state is searched for the input signal stored in the buffer memmory. By estimating the initial phase difference and the center frequency difference between the input signal and the VCO output with repetative kickoffs in calculators, optimum values mentioned above are obtained. In a normal operation mode as a second mode in which the PLL operates normally as a conventional PLL, a phase lock operation between the VCO outut as the reference signal and the input signal in the buffer memory is carried out after the PLL is kicked off with the optimum initial phase and the optimum center frequency determined in the initial training mode.

21 Claims, 8 Drawing Sheets

ADAPTIVE PHASE LOCK LOOP SYSTEM

BACKGROUND OF THE INVENTION

The present invention relates to a phase lock loop (PLL) for carrier regeneration, and/or clock regeneration in radio communication and satellite communication systems.

In digital radio communication and satellite communication systems using PSK (Phase Shift Keying) modulation, a receiver demodulates a PSK signal through a coherent detection which has excellent demodulation characteristics for transmission errors. In the coherent detection, a demodulator must have an accurate carrier which synchronizes with the phase of the transmitted carrier, and also has the same frequency as that of the transmitted carrier. To regenerate the carrier in the receiver, a PLL or a tuning circuit has been used.

In a mobile communication system, and/or a satellite communication system, there is a high channel noise, a large frequency offset, and a frequency shift caused by a doppler effect in the carrier frequency. These factors degrade the performance of the carrier recovery, and it is sometimes difficult to regenerate a stable carrier, resulting in a synchronization loss in such systems. Also, the PLL takes a long time to complete the pull-in and lock-in stages, and also the PLL falls out of lock often even after the PLL locked in.

To solve the above problems, it has been proposed to use a preamble long enough for the carrier regeneration. However, the transmission efficiency decreases. Further, if the synchronization loss in the system happens once because of the channel noise, fading disturbances, or the frequency shift after the synchronization is established, no carrier regeneration is possible in the receiving side, since no preamble is obtained.

In a low rate radio packet transmission system, no preamble is attached to a packet in view of transmission efficiency. In this system, the PLL which acquire the lock-in quickly and stably, and hold it tightly under a low C/N (Carrier to Noise power ratio) condition having a high noise has not been found.

FIG. 1 shows a block diagram of a prior carrier regeneration system which uses a digital PLL. A PSK modulation signal is applied to an input terminal (1) and is processed by a frequency multiplier (2) to generate a carrier component which is an integer multiple of a carrier frequency. The frequency multiplier (2) denotes a frequency doubler in case of two phase modulation, and a tripler in case of four phase modulation. The output of the frequency multiplier (2) is then applied to the conventional PLL (5) through the bandpass filter (3) from the PLL input terminal (4). The PLL (5) provides a VCO output which is locked-in with the carrier component and is free from the channel noise, and is obtained at the output terminal (6). The frequency divider (7) divides the frequency of the VCO output, and provides the regenerated carrier at the output terminal (8).

It should be appreciated in FIG. 1 that the input signal is supposed to be a digital signal, and all the elements in figures described in this invention operate in digital.

The PLL (5) has a phase detector (10) which detects the phase error between the input signal at the terminal (4) and the reference signal of the VCO output, a loop filter (11) coupled with the output of the phase detector (10), and a digital voltage controlled oscillator of VCO (9) as a reference signal generator. The VCO (9) consists of an accumulator (12), a center frequency generator (13), an initial phase generator (14), a cosine converter (15), and adders (16 and 17). The phase detector (10) receives the reference signal of the VCO output having a cosine waveform with the initial phase $\theta_0$ and the center frequency $W_0$, and the input signal having the carrier component from the input terminal (4). The phase difference and/or the frequency difference between the VCO output and the input signal is detected as the phase error by the phase detector (10), and then the output is applied to the loop filter (11) which suppresses undesired noise component. The bandwidth and gain of the PLL loop determines the performance of the pull-in and the lock-in.

The frequency of the VCO (9) is determined by the error signal from the loop filter (11) and the output of the center frequency generator (13) which provides a signal corresponding to the center frequency. The phase of the VCO (9) is also determined by the output of the accumulator (12), and the output of the initial phase generator (14) which provides a signal corresponding to the initial phase. The error signal from the loop filter (11) is added to the output of the center frequency generator (13) through the adder (16), and then is fed to the accumulator (12) which accumulates it at every sampling time. The output of the accumulator (12) is added to the output of the initial phase generator (14) through the adder (17), and then is fed to the cosine converter (15) which generates a cosine waveform as the VCO output. The output of the VCO (9) is applied to the phase detector (10) as a reference signal to the input signal. The locked VCO output is obtained at the output terminal (6), and the output frequency is divided by the frequency divider (7) which provides the regenerated carrier. The VCO (9) operates first to complete the pull-in stage for coinciding the frequency, and next to complete lock-in stage for the phase lock.

Since the circuit elements operate in digital, it should be noted that the center frequency generator (13) and the initial phase generator (14) provide a constant level corresponding to the center frequency and the initial phase, respectively. When the accumulator (12) accumulates the constant level signal corresponding to the center frequency at every sampling time, the output of the accumulator (12) becomes a ramp signal increasing with time. Also the accumulator (12) outputs a constant level signal to compensate the initial phase to the phase of the input signal. The initial phase generator (14) prepares the constant level signal corresponding to the initial phase to determine the initial phase of the VCO. The cosine converter (15) converts the input to the cosine waveform in a digital form. The output of the loop filter eventually adjusts the frequency and the phase of the VCO output through the accumulator (12) instantaneously. Therefore, it should be appreciated that the VCO (9) in FIG. 1 performs just as a conventional analog voltage controlled oscillator.

The frequency multiplier (2) increases the noise level by 6 dB in BPSK, and the phase detector (10) using a multiplier also generates some additional noise caused by the non-linear operation. Noise causes the pull-in and lock-in times longer, and further causes the out of lock after the lock-in state was achieved once. Therefore, when the C/N is very low, a stable carrier regeneration becomes difficult. Particularly, when a frequency offset and/or a frequency shift are large, the above problem becomes more serious.

When the loop gain of the PLL (5) is high, the pull-in and the lock-in times are short, however the sensitivity to noise becomes high, resulting in a large phase jitter and a frequency jitter in the VCO output at the terminal (6). On the other hand, when the loop gain of the PLL (5) is low and the bandwidth of the loop is narrow to remove the noise, the pull-in and lock-in capabilities for the frequency offset and the initial phase difference become low, resulting in narrower pull-in and lock-in ranges. Accordingly, it is difficult for the loop to lock, and a carrier loss happens. For example, when the value of the C/N is lower than 3 dB, it is almost impossible to regenerate the stable carrier in a prior art. Further, the prior phase detector using a multiplier has a disadvantage of a false lock.

The narrow bandwidth of the loop would have the disadvantage of taking a long time to achieve the lock-in state for the large frequency offset, and of being difficult to hold the lock-in state for the frequency shift. Conventionally, some improvements in the performance have been achieved by adjusting the bandwidth and gain of the loop, depending on whether it is before or after the lock-in stage, and/or by using a phase detector having a linear phase detection characteristics. For instance, the bandwidth of the loop is first set wider at the kick-off stage, considering the frequency offset, and then the bandwidth of the loop is switched narrower to avoid the out of lock state due to noise after the pull-in condition is established.

However, the mere switching of the loop gain and/or the bandwidth is insufficient to achieve a stable carrier recovery in an extremely low C/N condition having a large frequency offset in mobile satellite communications.

Further, a prior tuning circuit cannot regenerate the carrier in case of the large frequency offset, and/or the large doppler frequency shift.

SUMMARY OF THE INVENTION

It is an object, therefore, of the present invention to overcome the disadvantages and limits of a prior phase lock loop (PLL).

It is also an object of the present invention to provide a phase lock loop which completes a lock-in state widely and quickly under the conditions having a high input noise and a large frequency offset, and/or a large frequency shift.

The above and other objects are attained by an adaptive phase lock loop system comprising; a buffer memory (21) for storing the input digital signal; the phase detector (10) for detecting the phase error between the input signal in the buffer memory (21) and the reference signal of the digital VCO output; a loop filter (11) coupled with the output of said phase detector (10); a center frequency generator (13) for supplying a constant level signal corresponding to the center frequency of the VCO; an accumulator (12) for accumulating the sum of the outputs of the loop filter (11) and the center frequency generator (13) at the adder (16); an initial phase generator (14) for suppling a constant level signal corresponding to the initial phase of the VCO; a cosine converter (15) for converting the sum of the outputs of the accumulator (12) and the initial phase generator (14) at the adder (17) to supply the reference signal of the VCO output; wherein an initial phase difference calculator (23) coupled with the output of the loop filter (11) is prepared for updating the initial phase given by the initial phase generator (14) according to the output from the loop filter (11); and wherein a frequency difference calculator (24) coupled with the output of the loop filter (11) is prepared for updating a center frequency given by the generator (13) according to output from the loop filter (11); and wherein the PLL process has two modes, that is, an initial training mode and a normal operation mode.

In the initial training mode, the initial phase given by the generator (14) and the center frequency given by the generator (13) are adjusted repetitively, depending on the outputs of the calculators (23 and 24) to complete the lock-in stage. An optimum initial phase and an optimum center frequency for the input signal stored in the buffer memory (21) are obtained by estimating the initial phase difference and the center frequency difference between the same input signal in the buffer memory (21) and the VCO output, respectively, with the repetitive kick-off having the updated initial phase and center frequency. In the normal operation mode, the adaptive PLL operates as the conventional PLL by kicking it off with the optimum initial phase and the optimum center frequency obtained in the initial training mode. The reference signal of the VCO output is phase-locked quickly and stably with the input signal. During the normal operation mode, the initial phase difference calculator (23) and the center frequency difference calculator (24) do not operate, and the adaptive PLL works just like a conventional PLL.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS (Embodiment 1)

It is assumed that the input signal is in a digital form, and the PLL handles the digital signal. An A/D converter and a D/A converter which are used for converting analog signals and digital signals are not described as they are no concern with the present invention.

Figure 1:
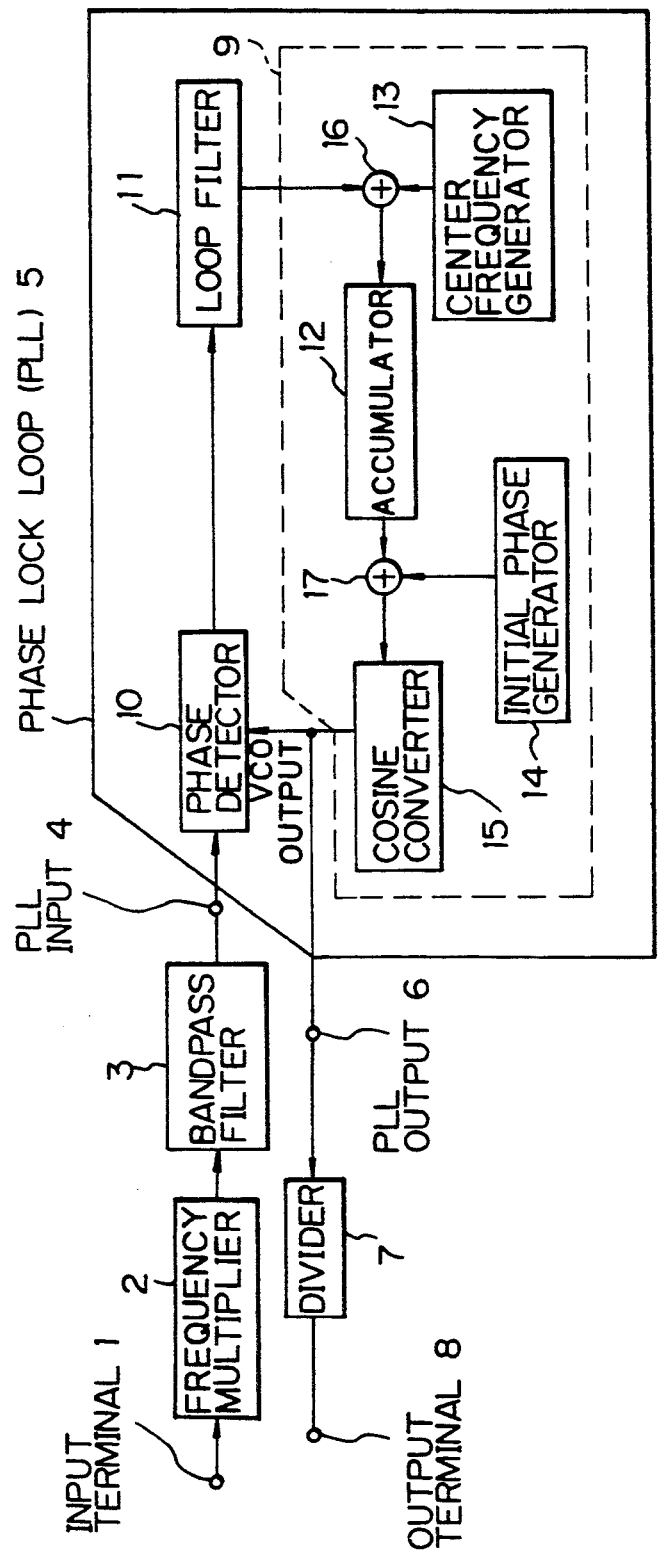
FIG. 1 is a block diagram of a prior carrier regeneration system using a phase lock loop.
Figure 2A:
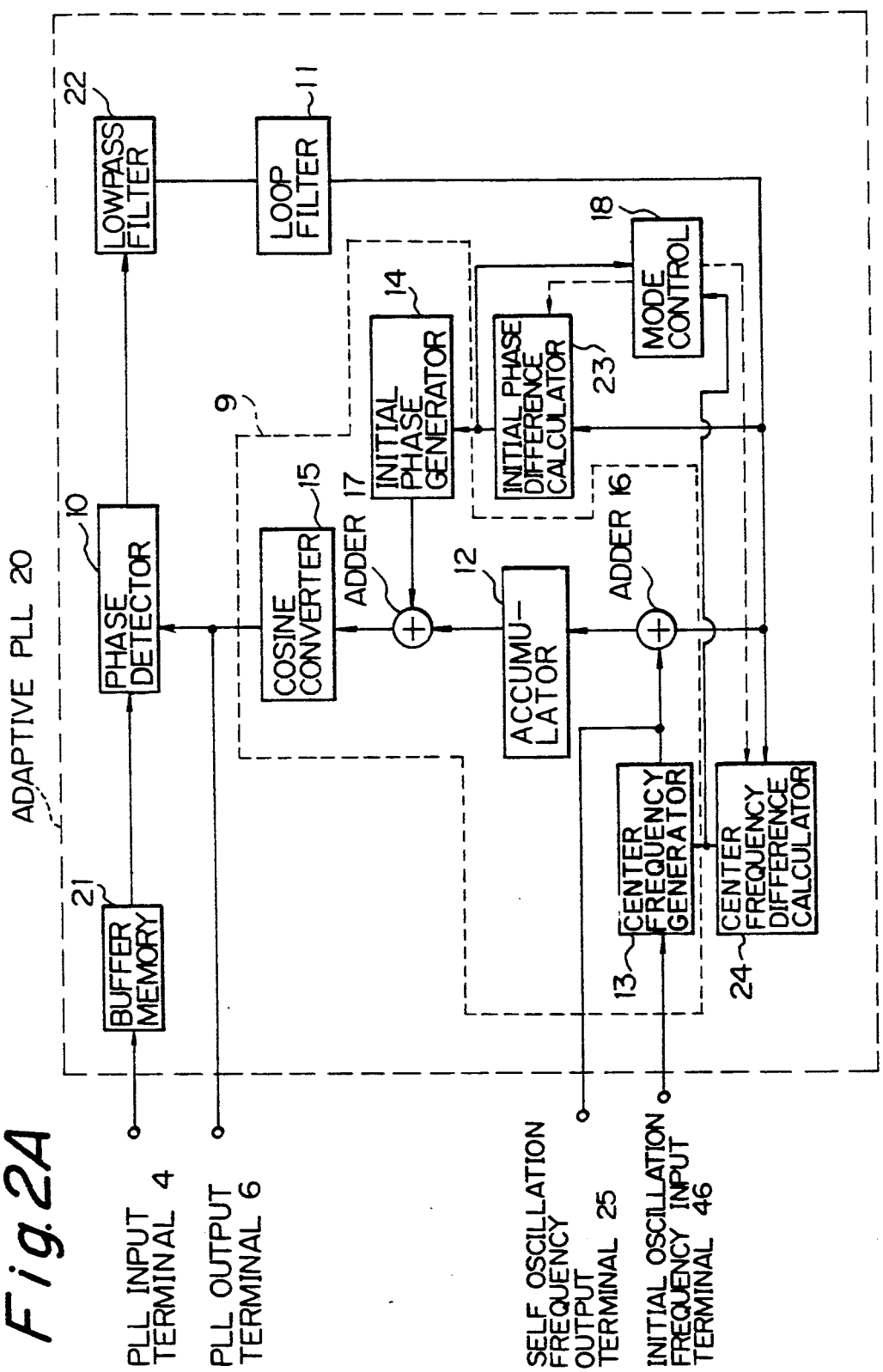
FIG. 2A is a block diagram of an adaptive phase lock loop according to the present invention.

FIG. 2A shows a block diagram of an adaptive PLL according to the present invention. The same numerals as those in FIG. 1 show the same elements.

The important feature of the present adaptive PLL (20) is the presence of a buffer memory (21) which stores an input signal from the input terminal (4), a lowpass filter (22) for removing noise, an initial phase difference calculator (23), a center frequency difference calculator (24), and a mode control (18) for switching the operation state between the initial training mode and the normal operation mode. The numeral 25 shows the output terminal of the center frequency of the adaptive PLL (20).

The operation of the apparatus of FIG. 2A has two modes. The initial training mode is the initial training stage to search an optimum initial phase and an optimum center frequency at the kick-off. During this mode, the processes to lock the PLL to the frequency and phase of the input signal are carried out repetitively for the same input signal stored in the buffer memory (21), adjusting the center frequency $W_0$ of the generator (13) and the initial phase $\theta_0$ of the generator (14). The normal operation mode is the ordinary PLL operation stage, in which the center frequency generator (13) and the initial phase generator (14) start to operate with the optimum initial phase and the optimum center frequency determined in the initial training mode, and the PLL operation is carried out for the input signal as the conventional manner in FIG. 1. The output terminal (6) provides the VCO output which is lock-in with the carrier component in the input signal.

In other words, the operation of FIG. 2A is the same as that of FIG. 1 except that the center frequency of the generator (13) and the initial phase of the generator (14) are adpatively controlled at the kick-off to lock the VCO output with the stored input signal in the buffer memory (21) through training the PLL processes, while the center frequency and the initial phase in FIG. 1 are always fixed during the operation. The training for optimizing the center frequency and the initial phase to complete the lock-in is carried out repetitively for the same input signal which is stored in the buffer memory (21) in the adaptive PLL (20). The optimum center frequency and initial phase are obtained by estimating the initial phase difference and the center frequency difference in the initial phase difference calculator (23) and the center frequency difference calculator (24), respectively.

The operation of the adaptive PLL (20) according to the present invention is now described in detail.

(1) An input signal to the PLL input terminal (4) is stored in the buffer memory (21) in a digital form. The memory (21) functions to provide the same digital signal repetitively in the initial training mode until the initial phase error given by the initial phase difference calculator (23) and the center frequency error given by the center frequency difference calculator (24) reach less than predetermined threshold values which denote optimum in the lock-in condition, respectively, or alternatively the initial training mode is repeated by the predetermined times which recognizes to achieve the optimum lock-in condition.

(2) In the initial training mode, it is assumed that the initial phase $\theta_0$ and the center frequency $W_0$ are initially predetermined as $\theta_{0int}$ and $W_{0int}$, respectively. The initial values $\theta_{0int}$ and $W_{0int}$ may be prepared inside the PLL, or alternatively, $W_{0int}$ may be supplied from an external apparatus which has a spectrum analyzer by using a linear prediction technique or other technique. The input terminal (46) is used for the external initial value for the center frequency, if necessary.

(2-1) First, the phase detector (10) detects the phase error between the input signal in the buffer memory (21) and the phase of the VCO output fed from the cosine converter (15). The output of the phase detector (10) is then applied to the loop filter (11) through the lowpass filter (22). Those filters suppress the noise component.

(2-2) Next, the error signal from the loop filter (11) is applied to the phase difference calculator (23) and the center frequency difference calculator (24). The adder (16) provides the sum of the output of the center frequency generator (13) and the loop filter (11), and then the sum is applied to the accumulator (12).

(2-3) The outputs of the accumulator (12) and the initial phase generator (14) are added at the adder (17), and the output is applied to the cosine converter (15). The cosine converter (15) generates a cosine wavefrom based upon the accumulator output and the initial phase.

When there is a difference between the frequency of carrier component of the input signal at the input terminal (4) and the center frequency of the VCO, the loop filter (15) provides a DC (direct current) component in the error signal depending on the frequency difference. The DC component in the error signal is detected in the frequency difference calculator (24). Similarly, when there is a phase difference between the phase of the input signal and the initial phase of the VCO, the loop filter (11) provides an impulsive error signal which has some amplitude and width in some duration just after the kick-off. During the duration, the error signal caused by the frequency difference is small. Accordingly, the amplitude of the the impulsive error signal mainly depends upon the value of the initial phase difference, and the amplitude decreases as the phase becomes in-lock. In the initial phase difference calculator (23), the initial phase error between the phases of the input signal and the VCO output is roughly estimated by the averaged amplitude of the impulsive error signal in a short duration after the kick-off.

The initial phase provided by the initial phase generator (14) is updated by the initial phase difference from the initial phase difference calculator (23), and the center frequency provided by the center frequency generator (13) is also updated by the center frequency difference fed by the center frequency difference calculator (24). Then, the PLL operation is carried out again for the same input signal which is stored in the buffer memory (21), by using the updated initial phase and the updated center frequency. The calculators (23) and (24) provided values of the initial phase difference and the center frequency difference for the next updating. The above operation is repeated by the times until it is presumed that the lock-in state is established. The optimum center frequency and initial phase are obtained finally.

When the initial training mode finishes, the mode is switched to the normal operation mode, according to one of the following ways.

(a) The initial training mode finishes when a predetermined number of trials for updating of the phase and the center frequency are carried out, or the initial phase and center frequency errors are minimized and are reached predetermined threshold values, respectively.

(b) An input signal is divided for every predetermined number of frames. The initial training mode is carried out for each frame, or for every predetermined number of frames, so that the initial phase and the center frequency are adjusted in the each frame. Then, the mode is switched to the normal operation mode.

(c) A lock-in detector is prepared for recognizing the lock-in state. The lock-in state may be recognized by the level of the lowpass-filtered quadrature phase error (or the level of in-phase component) between the VCO output and the input signal.

(d) The fourth method is that if the lock-out state happens in the normal operation mode, the initial training mode may be carried out again to attain the optimum initial phase and center frequency, and then switchover to the normal operation mode again.

(e) For the channel having a wide frequency offset, a plurality of bandpass filters are provided for splitting the transmission band of the output signal of the multiplier (2), and the adaptive PLL (20) is coupled with all or a part of the bandpass filters. In each PLL, a plurality of initial values of the center frequencies are prepared, each having a predetermined step of difference in the initial center frequency. Each initial center frequency is applied to the center frequency generator (13) through the terminal (46), and the initial training mode is carried out. When the optimum center frequencies for all the initial center frequencies become almost the same as one another, or the differences in the optimum center frequencies are minimum, it is recognized that there is a frequency which corresponds to the carrier component, and the adaptive PLL of the related band is switched to the normal operation mode.

It should be appreciated that the bandwidth of the lowpass filter (22) and/or the loop filter (11) may be set narrower for each training operation in the initial training mode, or when the initial training mode finishes. The narrow bandwidth of the loop improves the robustness of the PLL to noise without sacrifice the pull-in and lock-in ranges, because of the optimum initial phase and the optimum center frequency.

(3) After the initial phase and the center frequency are optimized in the initial training mode, the mode is switched to the normal operation mode with those optimum values.

In the normal operation mode, the phase detector (10) detects the phase error between the input signal and the VCO output, and the output of the phase detector (10) is applied to the adder (16) through the lowpass filter (22) and the loop filter (11). The loop gaina and the bandwidth of the loop filter (11) may be also adjusted during the operation.

It should be noted, therefore, that the initial phase difference calculator (23) and the center frequency difference calculator (24) do not operate in the normal operation mode.

It should be appreciated that FIG. 2A of the present invention has the feature of the presence of the initial phase difference calculator (23) and the center frequency difference calculator (24). These calculators obtain the optimum initial phase and the optimum center frequency in the initial training mode so that the synchronization system is tremendously improved in noise performance by using a narrower loop band and a lower gain in the PLL loop, and has equivalently a wide pull-in and lock in ranges. It is also easy to find the frequency offset and the initial phase offset in the input signal from the optimum center frequency difference and the optimum initial phase difference.

The frequency difference calculation by the calculator (24) is carried out according to the following formula [1] When there exists a center frequency error between the VCO output and the input signal, it gives a DC level at the input of the accumulator (12). Therefore, the center frequency error is roughly estimated by obtaining the DC component $\Delta W_e$ of the output of the loop filter (11) during a predetermined time duration, as given in formula [2]. The center frequency $W_0$ is updated by the center frequency difference calculated by the formula [3]. The center frequency difference decreases by repeating the above process.

On the other hand, the initial phase error appears as impulsive pulses mainly at the output of the loop filter in a short time duration just after kick-off. The time duration is given sooner than that for the frequency difference. Further, the DC component caused gy the center frequency error at the output of the loop filter (11) is small at that duration just after the kickoff. Therefore, the initial phase error is estimated roughly by the DC component in that duration according to the formula [4], and the initial phase difference is calculated by the formula [5].

As the component of the initial phase error in the output of the accumulator (12) becomes constant in a steady state, the initial phase difference calculator (23) stores the output $\phi$ of the accumulator (12), to estimate roughly the initial phase error $\Delta\theta_e$ by the formula [4'] using the center frequency error $\Delta We$, and then the initial phase difference is calculated by the formula [5].

The presumed center frequency difference $\Delta W_{0(j)}$ is the j'th trail (learning) in the center frequency difference calculator (24) is expressed as follows.

$$\Delta W_{0(j)} = \alpha \cdot \Delta W_{0(j-1)} + \beta \cdot \Delta W_{e(j)}, \quad [1]$$

where $\Delta W_0(0)=0$, $\alpha$ and $\beta$ are constants, satisfying $0 \leq \alpha, \beta \leq 1$.

The center frequency error estimation in the calculator (24) is carried out by the following formula [2].

$$\Delta W_e(j) = \sum_{i=N_1}^{N_2} Y(i)/N, \quad [2]$$

where $N = N_2 - N_1 + 1$, $Y(i)$ is the output of the loop filter (11), and i is the sample time index after the kickoff on the j'th trial. The formula [2] provides roughly the DC value of the output of the loop filter (11). The value $N_1$ and $N_2$ are fixed, and in one embodiment, $N_1$ is 30 and $N_2$ is 40.

The center frequency $W_{0(j+1)}$ on the (j+1)'th trial in the center frequency generator (13) is given below.

$$W_{0(j+1)} = W_{0int} + \Delta W_{0(j)}, \quad [3]$$

where $W_{0int}$ is the initial value of the center frequency of the generator (13). $W_{0int}$ may be a fixed value, the center frequency obtained in the normal operation mode of the normal operation PLL process, as mentioned later, or an external value given by a spectrum analysis of the input signal. The external value is applied to the generator (13) through the terminal (46), is necessary.

Thus, the center frequency $W_0$ is adaptively updated so that the VCO output synchronizes with the input signal in frequency.

On the other hand, the initial phase error is estimated in the calculator (23) according to the following formula [4].

$$\Delta\theta_e(j) = \sum_{i=N_1}^{N_2} Y(i)/N, \quad [4]$$

where $N=N_4-N_3+1$, and $N_3$ and $N_4$ are sampling index number where the frequency error component of the output of the loop filter is not large just after the kick off. In one embodiment, $N_3=1$ and $N_4=10$.

Alternatively, the phase error $\Delta\theta_e(j)$ on the j'th trial is estimated by the formula [4'].

$$\Delta\theta_e(j) = \sum_{i=N_1}^{N_2} \{\phi(i) - (\Delta W_e(j) + W_0(j))*(i-n_1)\}/N, \quad [4']$$

where $N=N_2-N_1+1$, $\phi(i)$ is the output of the accumulator (12) at i'th sampling time after kick-off, $\phi(i)=\phi(i-1)+Y(i)$, and $\phi(0)=0$.

The initial phase difference $\Delta\theta_0(j)$ is given by $$\Delta\theta_0(j) = \alpha*\Delta\theta_{0(j-1)} + \delta*\Delta\theta_e(j), \quad [5]$$

where $\gamma$ and $\delta$ are constants satisfying $0 \leq \gamma$ and $\delta \leq 1$.

The initial phase of the VCO output on the J+1'th trial is;

$$\theta_0(j+1) = \theta_{0int} + \Delta\theta_0(j), \quad [6]$$

where $\theta_{0int}$ is the initial value for the initial phase of the VCO output at the beginning of the kick-off. Thus, the initial phase $\theta_0$ is updated adaptively so that the PLL is lock-in to the input signal. The $\theta_{0int}$ is a fixed value, or may be the initial phase of the reference signal obtained in the normal operation PLL process, as mentioned late.

As described above, the center frequency $W_0(j)$ and the initial phase $\theta_0(j)$ obtained by the formulas [3] and [6] are used as the j'th trial in the initial training mode, the optimum center frequency and the optimum initial phase for the lock-in state are obtained finally.

It should be appreciated that the bandwidth of the loop and the lowpass filter (22), may be adjusted to be narrow in each initial training mode, or at the end of the initial training mode. The narrow bandwidth improves the accuracy of the center frequency and initial phase differences.

Figure 4:
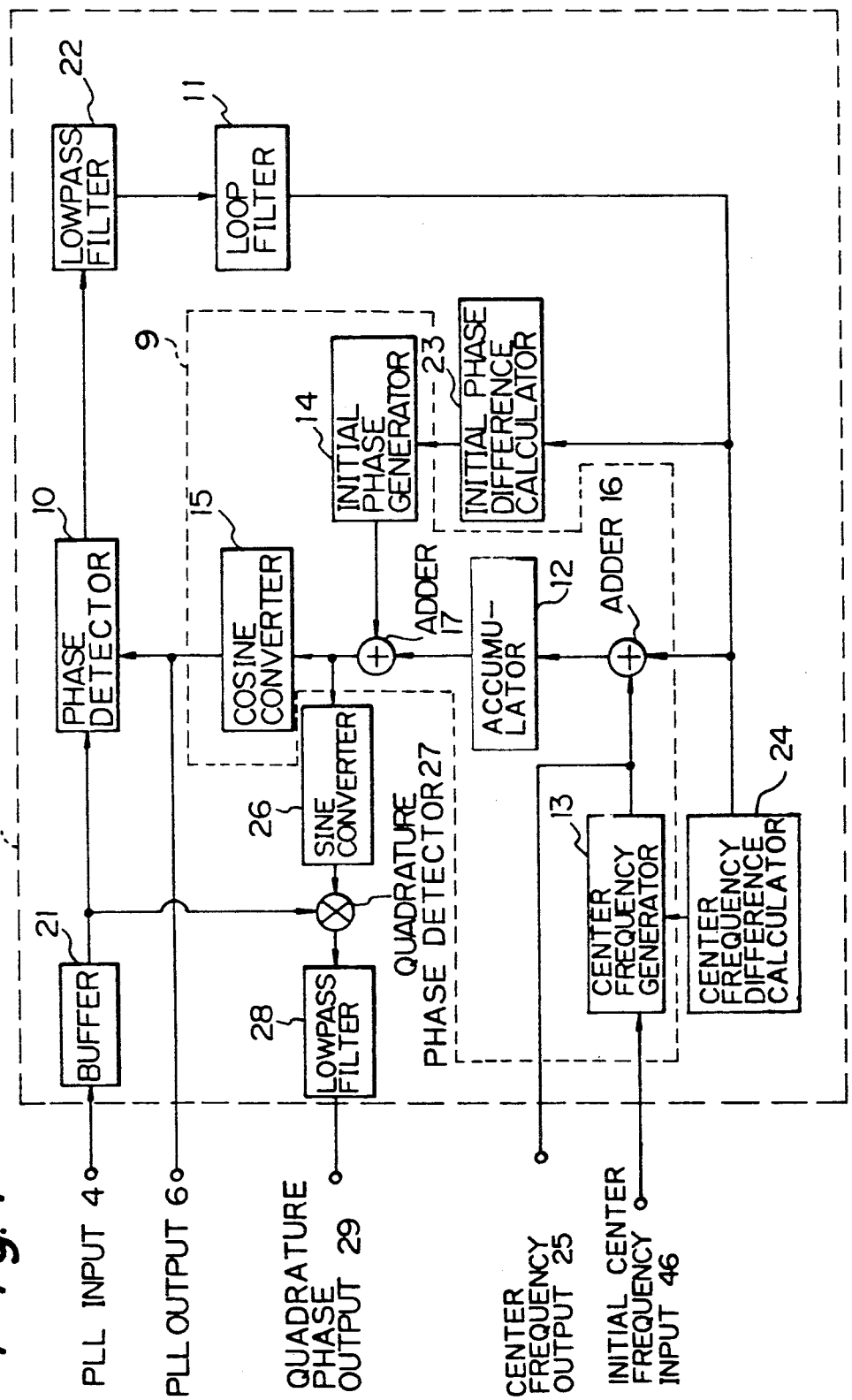
FIG. 4 is a block diagram of another adaptive phase lock loop according to the present invention.

The initial training mode finishes when a predetermined times are carried out, or $\Delta W_e(j)$ and $\Delta\theta_e(j)$ reach less than predetermined values, respectively. Alternatively, as shown in FIG. 4, a synchronization detector has a sine converter (26), a quadrature phase detector (27) having a multiplier, and a lowpass filter (28). The synchronization detector can indicate the lock-in state, when the output level of the lowpass filter (28) exceeds a predetermined value. Alternatively, an inphase difference component is detected at the output to the phase detector (10) through a lowpass filter (not shown), and when that component becomes less than a predetermined value, the lock-in state is recognized.

As described above, the optimum center frequency and the optimum initial phase are obtained finally in the initial training mode, and then the ordinary PLL operation is carried out with the optimum center frequency and initial phase at the kick-off in the normal operation mode. The gain of the loop is switched lower, and the bandwidth is also switched narrower in the normal operation mode. Thus, the stable PLL which is free from frequency offset and noise is obtained. When the system becomes out of the lock-in state, the synchronization detector detects the asynchronization state, and the initial training mode is carried out again to find the optimum center frequency and the optimum initial phase for recovering the synchronization.

Figure 2B:
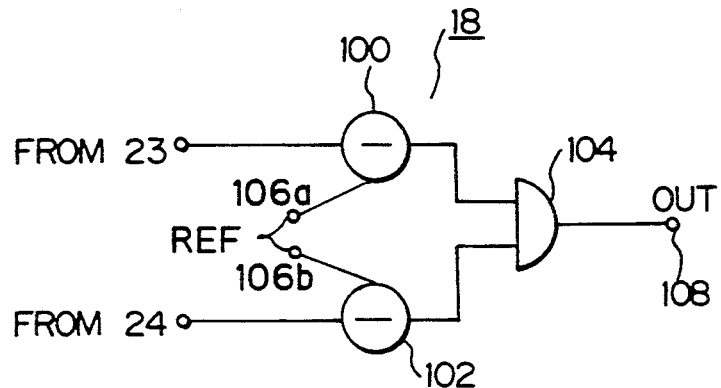
FIG. 2B is a block diagram of a mode control 18.

FIG. 2B shows a block diagram of the mode control 18. In FIG. 2B, the numerals 100 and 102 are subtracters, 104 is an AND circuit, and 108 is an output terminal. The first subtractor (100) receives the initial phase error from the calculator (23) and the reference value on the terminal (106a). The second subtracter (102) receives the center frequency error from the calculator (24) and the reference value on the terminal (106b). It is assumed that the subtracter provides one when the reference value on the terminal is larger than the error from the calculator. When both the subtracters (100 and 102) provide one, the AND circuit (104) outputs one, which switches the mode from the initial training mode to the normal operation mode.

Therefore, the center frequency of the center frequency generator (13) is set to the center frequency at the end of the initial training mode, and the initial phase of the initial phase generator (14) is also set to the initial phase at the end of the initial training mode.

Figure 2C:
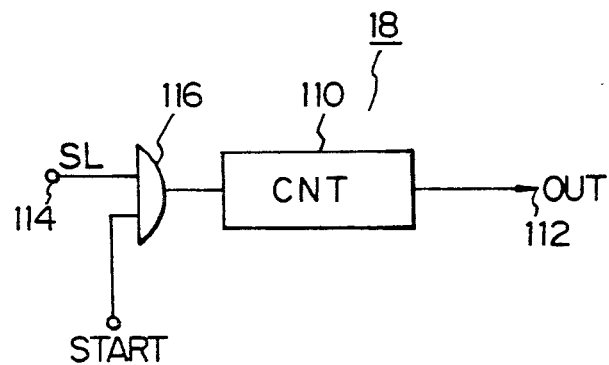
FIG. 2C is a block diagram of another embodiment of a mode control (18)

FIG. 2C shows another block diagram of the mode control (18), in which a counter (110) and an AND circuit (116) is prepared. The AND circuit (116) receives a pulse which is generated in each period to execute the process of the trial in the initial training mode, and a START pulse which is in ON state during the initial training mode. The counter (110) provides an output signal when it counts M input pulses, on the assumption that M is the number of training cycles predetermined in the initial training pulses. When the counter (110) provides an output signal on the output terminal (112) to switch the mode from the initial training mode to the normal operation mode, and then, the start pulse START is reset to a low level, and the calculators (23) and (24) also stop the operation.

Figure 2D:
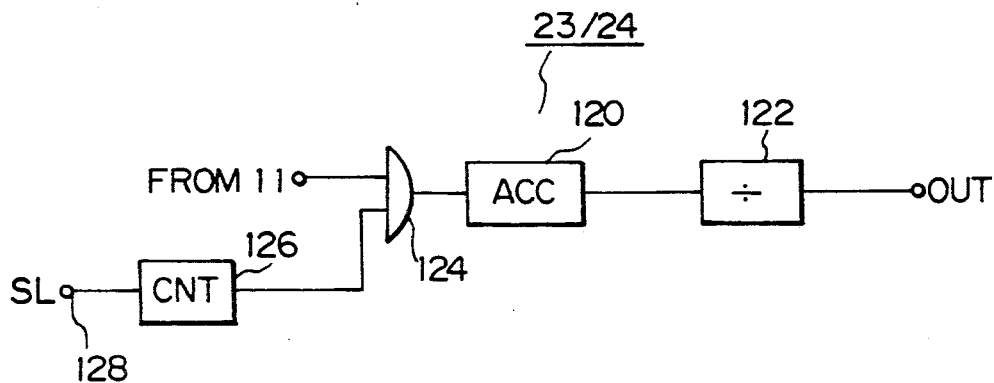
FIG. 2D is a block diagram of a part of an initial phase difference calculator and a part of a center frequency difference calculator.

FIG. 2D shows a block diagram of the calculation of the initial phase error or the center frequency error by formula [2] or [4] in the calculator (23) or (24). The calculation is implemented with an accumlator (120), and AND circuit (124), a counter (126), and a divider (122). The counter (126) receives the sampling pulse on the terminal (128), and it is assumed that the content of the counter (126) repeats in every 40 sampling pulses. The counter (126) provides a positive output from 1 to 10 sampling pulses in case of the initial phase difference calculator (23), and provides a positive output from 30 to 40 sampling pulses in case of an initial frequence difference calculator (24). The AND circuit (124) receives the output of the loop filter 11 and the output of the counter (126), therefore, the AND circuit (124) provides an output the loop filter (11) during 1 and 10 sampling pulses for calculator (23), and during 30 and 40 sampling pulses in case of the calculator (24). The divider (122) divides the output value of the accumulator (120) by 10. Thus, it should be noted that the circuit of FIG. 2D carries out the formulas [2] and [4]. It should be noted that the above assumption that each process has 40 sampling pulses duration and it takes 10 sampling pulses for averaging, is the practical assumption in a real apparatus.

The lowpass filter (22) is used for improving loop noise characteristics and suppressing non-linear distortion in the phase detector (10). When the noise level in the input signal is low, no lowpass filter (22) is necessary.

Figure 3:
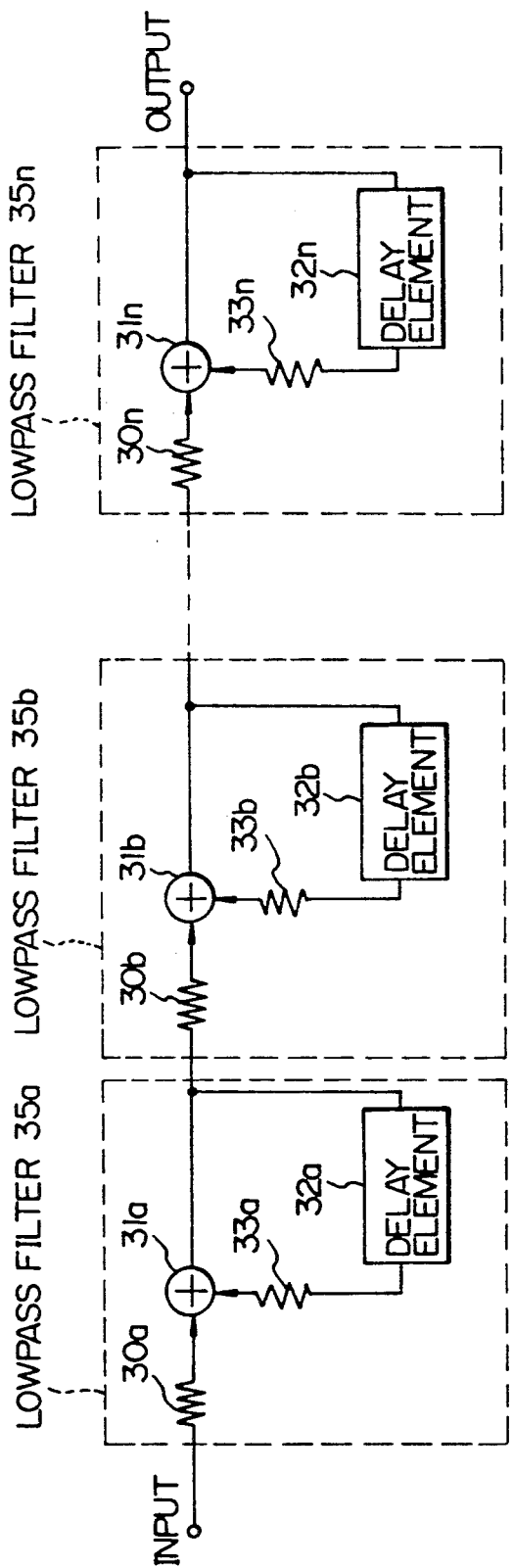
FIG. 3 is a block diagram of a lowpass filter (22) in FIG. 2.

FIG. 3 shows a block diagram of the lowpass filter (22). The lowpass filter has a plurality of connected units in serial each having a multiplier (30a) with a coefficient, and an adder (31a), a delay element (32a) with a delay time equal to the sampling period of the input digital signa, and a multiplier (33a) with a coefficient. The filter characteristics including the bandwidth and the gain are controlled by adjusting the coefficients of the multipliers (30a and 33a).

The present adaptive PLL is used not only for regenerating carrier frequency, but also for regenerating a clock signal.

FIG. 4 shows a modification of FIG. 2. The feature of the PLL (20') in FIG. 4 is the presence of a sine converter (26) coupled with the output of the adderr (17), a quadrature phase detector (27) which has a multiplier coupled with outputs of the buffer memory (21) and the sine converter (26), and a lowpass filter (28) coupled with output of the detector (27). The output of the lowpass filter (28) is the quadrature phase component to the input signal, and may be used for AGC (Automatic gain control) for keeping the power of the inpit signal constant. Also, the output of the lowpass filter (28) is used as the synchronization detector which shows the lock-in state.

(Embodiment 2)

Figure 5:
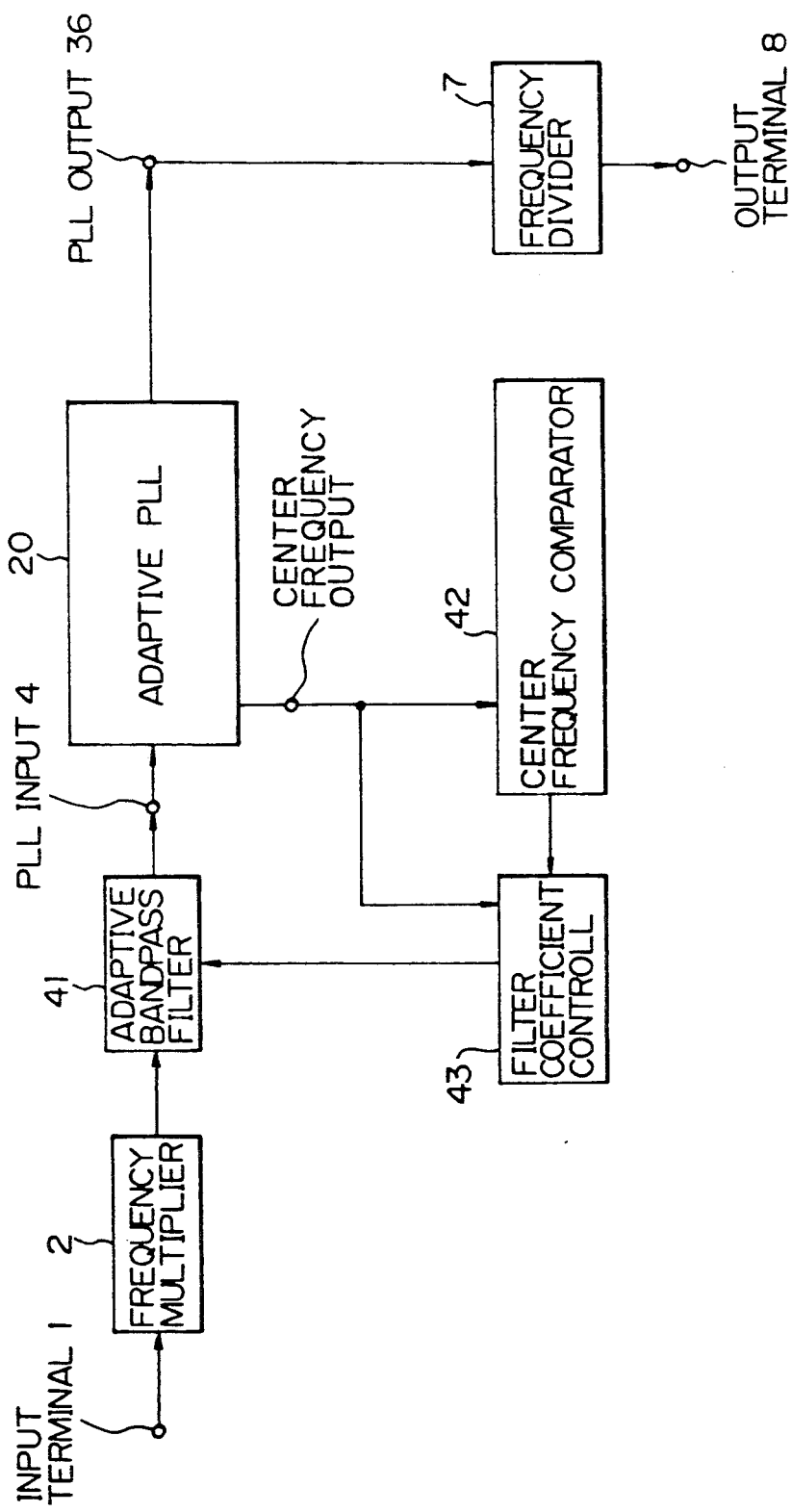
FIG. 5 is a block diagram of a carrier regeneration system according to the present invention.

FIG. 5 shows a block diagram of a carrier regeneration system according to the second embodiment of the present invention. The embodiment of FIG. 5 is useful for carrier regeneration in poor C/N in QAM-PSK, four phases PSK, eight phases PSK, and other OKS which requests a high-order frequency multiplication to extract the carrier component.

The feature of FIG. 4 as compared with FIG. 2A is the presence of an adaptive bandpass filter (41) at the input of the adaptive PLL (20). The filter (41) is comprised of a digital filter or FFT (Fast Fourier Transform) filter, and adjusts at least one of the center frequency and the bandwwidth of the filter to remove the noise in the input signall as much as possible.

The band of the adaptive bandpass filter (41) may be divided into a plurality of subbands so that each subband bandpass filtered adaptively is followed by a related adaptive PLL. The system using the subbands is useful to search the carrier offset distributed in a wide range.

The method for detecting the carrier component and its frequency is now described.

(1) An input signal is applied to the adaptive PLL (20) through the adaptive bandpass filter (41) which has predetermined filter characteristics.

(2) The adaptive PLL (20) performs the initial training mode by setting the different initial center frequencies $W_{0int1}$ and $W_{0int2}$ of the VCO according to the formula [3].

(3) Each of the center frequencies thus obtained are fed to the center frequency comparator (42) through the output terminal (25), and are tested if the following inequality is satisfied or not.

$$|W_{01(j)} - W_{02(j)}| \leq \tau, \qquad [7]$$

where $\tau$ is a constant, j is the numberr of trial, $W_{01(j)}$ is the center frequency obtained for the initial value $W_{0int1}$, and $W_{02(j)}$ is the center frequency obtained for the initial value $W_{0int2}$, respectively.

(4) When the inequality [7] is satisfied within a predetermined number of trial times, it is assumed that the input signal in the band includes the particular carrier component since different initial center frequencies converge to the same center frequency in the lock-in state.

(5) If the input signal has only noise component, the inequality [7] is not satisfied.

Thus, the presence of the carrier component is detected, and the frequency of the carrier component is estimated by the center frequency $W_{01(m)}$.

(6) The outputs of the adaptive PLL (20), and the comparator (42) are applied to the filter coefficient control circuit (43) for the adaptive bandpass filter. The frequency offset can be estimated by the center frequency of the adaptive PLL (20). According to the information from the comparator (42) and the center frequency of the adaptive PLL (20), the circuit (43) adjusts the bandwidth and the center frequency of the adaptive bandpass filter (41) to decrease the noise component, tracking the carrier frequency component. The adjustment of the filter (41) is implemented simply by the selection of the filter coefficients prepared.

(7) Through the adaptive bandpass filter (41), the noise in the input signal is dramatically decreased even under the conditions of large frequency offset and shift in the input signal, and the adaptive PLL locks in stably and easily holds the lock-in state. Accordingly, the stable carrier regeneration is possible even in a heavily degraded channel with a high level of noise or fading.

(Embodiment 3)

Figure 6:
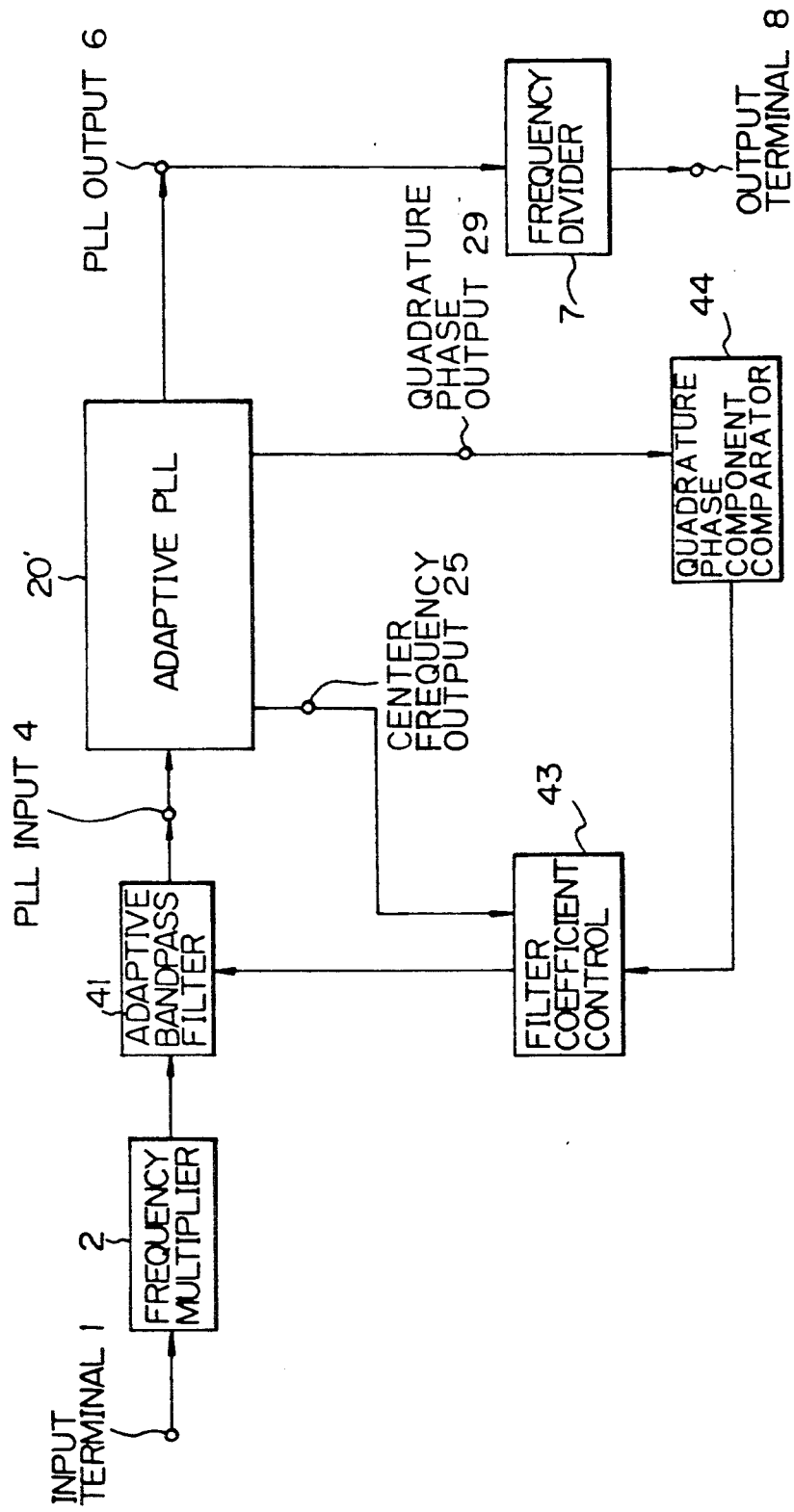
FIG. 6 is a block diagram of another carrier regeneration system according to the present invention.

FIG. 6 shows the third embodiment of the present invention, in which a carrier is regenerated by using a quadrature phase component comparator (44).

The feature of the embodiment of FIG. 6 is that the adaptive PLL (20') provides the quadrature phase component, the quadrature phase component comparator (44) is coupled with the output of the PLL (20') for controlling the filter coefficient control circuit (43). Alternatively, the inphase component is also used instead of the quadrature phase component.

The operation is as follows.

(1) The input signal is appled to the PLL (20') through the frequency multiplier (2) and the adaptive bandpass filter (41), which has a predetermined bandwidth and a initial center frequency at the initial stage.

(2) The adaptive PLL (20') carries out the initial training mode by using different initial center $W_{0int1}$ and $W_{0int2}$ according to the formula [3]. This step is the same as that of the embodiment (2).

(3) The quadrature phase component comparator (44) tests if the following inequality is satisfied or not, concerning the quadrature output in each trials.

$$\sum_{i=N_1}^{N_2} |AQ_{01}(j,i) - AQ_{02}(j,i)| \leq \epsilon, \qquad [8]$$

where $\epsilon$ is a constant, j is the number of trials times, $I_1$ and $I_2$ are the sampling time index after the kick-off, $AQ_{01(j)}$ is the quadrature phase component obtained for the initial center frequency of $W_{01int1}$, and $AQ_{0int2}$ is obtained for $W_{0int2}$.

(4) When the inequality [8] is satisfied within a predetermined number of trial times, it is assumed that the input signal includes a carrier component, since different initial center frequencies provide finally the same center frequency in the lock-in state.

(5) If the input signal has only noise, the inequality [8] is not satisfied. Thus, the presence of the carrier component is detected. The frequency of the carrier component can be estimated by the center frequency $W_{01(j)}$, when [8] is satisfied.

(5') Alternatively, in the quadrature phase component comparator (44), only the level of the quadrature phase component obtained for the initial center frequency $W_{01intl}$ is compared with a predetermined threshold value. If the input signal has only noise component, the threshold is not exceeded. Thus, the presence of the carrier component can be detected. The frequency of the carrier component can be estimated by the center frequency $W_{01(j)}$, when the level exceeds the threshold. The out of lock is also detected by using the quadrature phase component in the quadrature phase component comparator (44).

(6) The output of the comparator (44) is applied to the filter coefficient control circuit (43), which adjusts the bandwidth and the center frequency of the bandpass filter (41) so that the noise component in the input signal is decreased.

(7) The input signal is applied to the PLL (20') through the bandpass filter (41) which is adjusted so that the bandwidth is narrower, tracking the carrier component. The center frequency of the bandpass filter (41) can be also adjusted by the center frequency from the PLL (20') so that the carrier frequency component does not go beyond the bandwidth of the bandpass filter due to the frequency shift in the input signal. Thus, the noise component in the input signal is dramatically decreased even under the conditions of large frequency offset and shift, and the carrier regeneration is possible even in a heavily degraded channel with high level of noise and fading.

(Embodiment 4)

Figure 7:
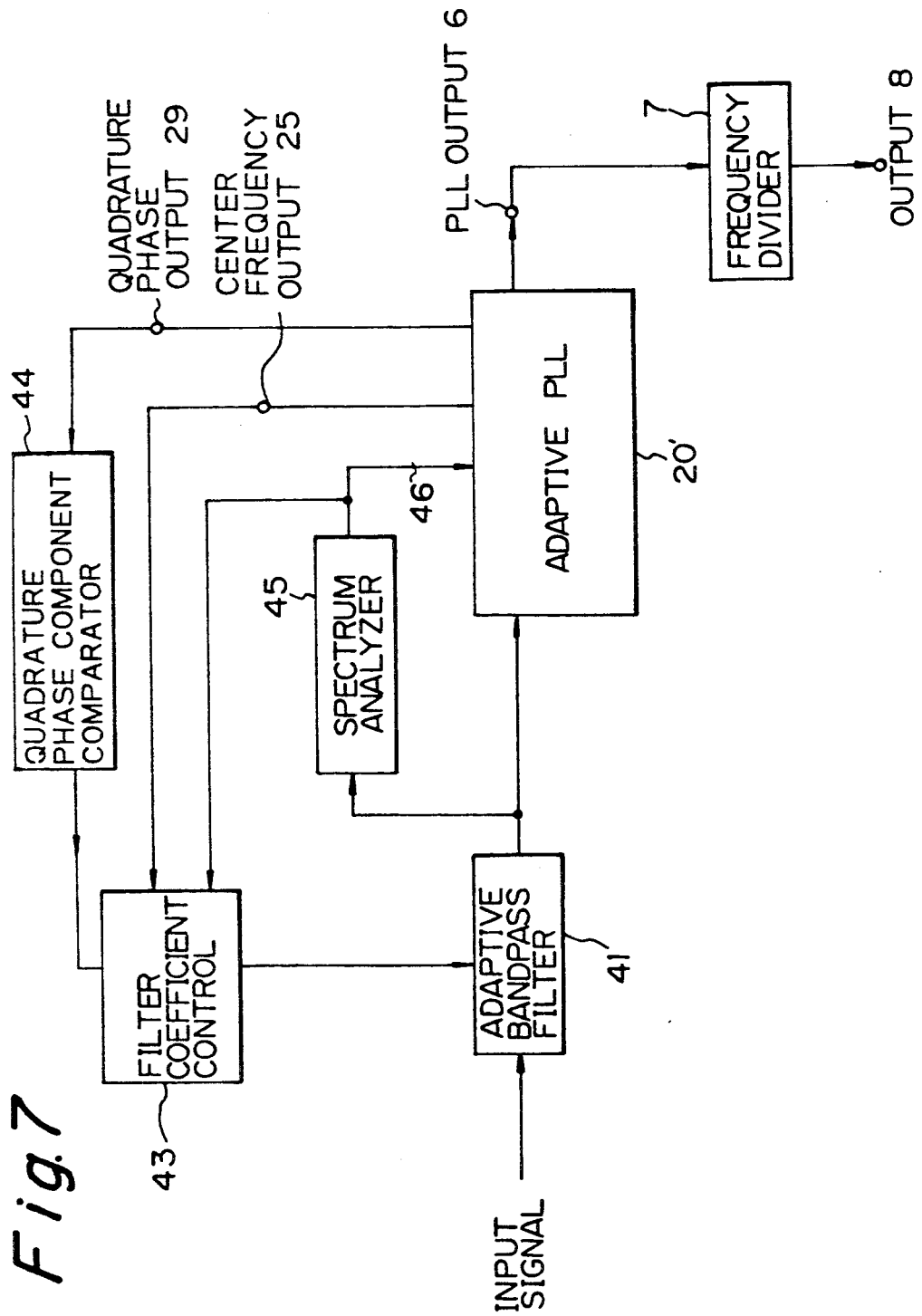
FIG. 7 is a block diagram of still another carrier regeneration system according to the present invention.

FIG. 7 shows a block diagram of fourth embodiment of the present invention. The feature of FIG. 7, as compared with FIG. 6, is the presence of a spectrum analyzer (45) which estimates the carrier frequency component, and the presumed frequency is used as the initial center frequency of the adaptive PLL (20') and the bandpass filter (41). The spectrum analyzer (45) is implemented as an FFT or linear prediction spectrum analyzer. The filter coefficient control circuit (43) operates with the outputs of the PLL (20') and the spectrum analyzer (45) to adjust the center frequency and the bandwidth of the bandpass filter (41).

In case that the carrier frequency component is shifted due to the doppler effect after the clock-in state established, the center frequency of the PLL (20') is monitored at the terminal (25), and then the center frequency of the bandpass filter (41) is adjusted so that the carrier frequency component does not go beyond the bandwidth of the bandpass filter.

When the frequency offset in the input signal is so large that a single bandpass filter can not cover the range of the offset, because of the increment of noise, the output band of the frequency multiplier (2) is divided to a plurality of bandpasses, each of which has an adaptive bandpass filter coupled with a related PLL. The initial center frequency of each PLL may be set to the center frequency of each bandpass filter. The carrier component is detected by the locked adaptive PLL (20'). When one of the PLL's detects the carrier component in the input signal, the carrier regeneration is carried out by the PLL. In the system using the plural bandpass filtering, the frequency divider 7 may be common to all the PLL's.

As a modification, a plurality of bandpass filters is prepared, and one of the bandpass filters is selected so that the inband power in the bandpass filter is the maximum, when the bandpass filters receive the carrier component. The selected bandpass filter is then connected to the adaptive PLL.

As another modification, when the bandwidth of the bandpass filter (41) is very narrow by adjusting the filter coefficients, the output of that bandpass filter (41) may be coupled with the input of the frequency divider (7) directly to provide the regenerated carrier frequency.

As a still another modification, two phase lock loops are prepared so that the first PLL carries out only the initial training mode, and the second PLL perform the conventional PLL process. When they are kicked off, or periodically kicked off, the second PLL is activaated with the initial phase and center frequency given by the first PLL after the initial training mode is performed.

Finally, the effects of the present invention are enumerated.

(1) The present invention has an initial training mode in which an optimum center frequency and an optimum initial phase are determined by using the same input signal stored in a buffer memory repetitively, and a normal operation mode in which the optimum values determined in the initial training mode are set and is kicked off. Therefore, the pull-in range and teh lock-in range is equivalently enlarged, and the noise bandwidth is decreased by using a narrower bandwidth of the loop in the PLL. Even when the noise power in the input signal is high, and the frequency offset is large, the PLL easily completes the lock-in, and the operation after the lock-in is also stable, holding the lock-in. In a poor C/N channel having a large frequency offset, where a prior PLL easily hangs up, the carrier has been stably regenerated by using the optimum center frequency and the optimum initial phase in the PLL, and by adjusting the center frequency and the bandwidth of the adaptive bandpass filter according to the center frequency of the PLL to reduce noise in the band having the carrier component.

(2) The bandwidth of the lowpass filter and/or the loop prepared in the PLL may be adjusted narrower at every trial in the initial training mode, or when the initial training mode finishes. Thus, the accuracy of the presumption of the optimum center frequency and the optimum initial phase by the calculator (23) and (24) is improved, and the synchronization is more stable.

(3) The band having a carrier component may be divided into a plurality of subbands, each of which has an adaptive bandpass filter followed by an adaptive PLL. The frequency corresponding to the carrier component is presumed by the optimum center frequency in the locked PLL. The center frequency and/or the bandwidth of the connected bandpass filter is adjusted according to the center frequency of the locked PLL. Accordingly, the carrier regeneration in a poor C/N condition is possible in this system. Also, the system can follow the frequency shift due to doppler effect after the lock-in state is established, optimizing the center frequency of the PLL and adjusting the center frequency of the bandpass filter.

(4) The stable detection of the lock-in in the PLL in item (3) is further improved by using the quadrature phase component in the PLL.

(5) The frequency of the carrier component is roughly estimated directly by a spectrum analysis of the input signal. The use of the frequency to determine the center frequency of the bandpass filter and/or the initial center frequency of the adaptive PLL improves more the operation of the PLL in achieving the lock-in quickly.

(6) An input signal is divided into a plurality of frames each having a predetermined duration, and the initial training mode in the PLL is carried out for each frame. The synchronization does not pull-out in that system even in a poor C/N channel having a large frequency shift.

(7) Even if the synchronization is pull-out, it is easily recovered by detecting the pull-out condition, and conducting the initial training mode.

(8) The center frequency and/or the bandwidth of a bandpass filter followed by the PLL is adjusted adaptively according to the center frequency of the PLL both in the initial training mode and the normal operation mode. The carrier regeneration in a poor C/N channel becomes possible.

(9) One of the bandpass filters to cover the wide range of the frequency offset is selected so that the output power of the selected bandpass filter is the maximum and the connected PLL provides the lock-in state. It is assumed that a carrier component resides in the selected bandpass filter, and the center frequency and/or the bandwidth of the selected bandpass filter is adjusted by the center frequency of the PLL. The carrier regeneration is possible even in a poor C/N channel having a large frequency offset.

The present invention can operate even for a transmission signal which has no preamble and/or packetized, and have the advantages that the hardware structure is simple, the delay time by the PLL operation can be designed to be small, and the quick synchronization in a short time is possible without false lock. Therefore the present invention is applicable for instance, to mobile communication systems, mobile satellite communication systems, and/or TDMA satellite communication systems with high speed and high capacity.

From the foregoing, it will now be apparent that a new and improved phase lock loop, has been found.

It should be understood of course that the embodiments disclosed are merely illustrative and are not intended to limit the scope of the invention. Reference should be made to the appended claims, therefore, rather than the specification as indicating the scope of the invention.

What is claimed is:

1. An adaptive phase lock loop system comprising:
 a buffer memory for storing a digital input signal;
 a phase detector for comparing a phase of the digital input signal and a phae of a reference signal;
 a loop filter coupled with an output of said phase detector;
 a digital voltage controlled oscillator providing a VCO output as the reference signal to said phase detector, said digital voltage controlled oscillator including
  a center frequency generator providing a center frequency of said digital voltage controlled oscillator,
  a first adder to provide a sum of an output of said loop filter and an output of said center frequency generator,
  an accumulator accumulating an output of said first adder,
  an initial phase generator providing an initial phase of said digital voltage controlled oscillator,
  a second adder providing a sum of an output of said accumulator and an output of said initial phase generator,
 a cosine converter converting an output of said second adder to a cosine waveform for providing the reference signal of the VCO output,
  an initial phase difference caclulator, coupled with the output of said loop filter, said initial phase difference calculator updating the initial phase output fromm said initial phase generator,
  a center frequency difference calculator, coupled with the output of said loop filter, said initial phase difference calculator updating the initial phase output from said initial phase generator according to the output of said loop filter,
  a center frequency difference calculator, coupled with the output of said loop filter, said center frequency difference calculator updating the center frequency output from said center frequency generator accordiing to the output of said loop filter, and
  a mode control means for switchin an operation state between an initial training mode and a normal opeation mode;
 wherein said initial training mode repetitively adjusts the initial phase and the center frequency of said initial phase difference calculator and said center frequency different calculator so that the initial phase and the center frequency become optimum to complete a lock-in state for the input signal of said buffer memory, respectively, and said normal operation mode providing a reference signal of the VCP output so that said reference signal is phase-locked with the input signal by using the initial phase and center frequency optimized in said initial training mode.

2. An adaptive phase lock loop system according to claim 1, wherein said initial training mode is switched to said normal operation mode when an initial phase error obtained from the output of said loop filter in said initial phase difference calculator and a center frequency error obtained from the output of said loop filter in said center frequency difference calcultor are less than a predetermiend threshold.

3. An adaptive phase lock loop system according to claim 1, wherein said initial training mode is switched to said normal operation mode when updatings of the initial phase and the center frequency of said digital voltage controlled oscillator in the initial training mode is carried out a predetermined number of times.

4. An adaptive phase lock loop system according to claim 1, wherein the center frequency and the initial phase of the digital voltage controlled oscillator are updated at repetitive kick-offs for a same input signal in said buffer memory by estimating an initial phase difference from said initial phase error and a center frequency difference from said center frequency error in said initial training mode.

5. An adaptive phase lock loop system according to claim 1, wherein a lowpass filter is provided between the output of said phase detector and an input of said loop filter.

6. An adaptive phase lock loop system according to claim 1, wherein a bandwidth of a PLL loop is switched narrower when said initial training mode is switched to said normal operation mode.

7. An adaptive phase lock loop system according to claim 1, wherein a bandwidth of a PLL loop is switched narrower in every trial operation in said initial training mode.

8. An adaptive phase lock loop system according to claim 1, wherein a bandpass filter is provided at an input of said buffer memory, an initial center frequency of said digital voltage controlled oscillator in an adaptive PLL coupled with said bandpass filter is provided by the center frequency of said bandpass filter, a carrier component is detected by obtaining the center frequency of said digital voltage controlled oscillator in which a lock-in state is detected by a quadrature phase component or an inphase component, and at least one of a center frequency and/or bandwidth of said bandpass filter is adjusted based upon the center frequency of said digital voltage controlled oscillator.

9. An adaptive phase lock loop system according to claim 1, wherein a bandpass filter is provided at an input of said buffer memory, initial center frequencies of said digital voltage controlled oscillator in an adaptive PLL coupled with said bandpass filter are predetermined in the initial training mode, a carrier component is detected by obtaining a same center frequency for different initial center frequencies or a minimum frequency difference between those center frequencies, and at least one of center frequency and/or bandwidth of said bandpass filter is adjusted based upon the center frequency of said digital voltage controlled oscillator.

10. An adaptive phase lock loop system according to claim 1, wherein bandpass filter is provided at an input of said buffer memory for dividing a bandwidth of the input signal into a plurality of bandwidths, an initial center frequency of said digital voltage controlled oscillator in an adaptive PLL coupled with the bandpass filter is provided by the center frequency of each band, a carrier component is detected through the bandpass filter which has a same center frequency as that of another band or has a minimum frequency different between those bands, or is related to said adaptive PLL in which a lock-in state is detected by a quadrature phase component or an inphase component, and at least one of center frequency and/or bandwidth of said bandpass filter is adjusted based upon a center frequency of said digital voltage controlled oscillator of said related adaptive PLL.

11. An adaptive phase lock loop system according to claim 8, wherein said quadrature phase component or said inphase component of the input digital signal of said adaptive PLL and the reference signal is compared in a quadrature phase detector or said phase detector to detect the lock-in state.

12. An adaptive phase lock loop system according to claim 8, wherein at least one of center frequency and bandwidth of said bandpass filter and the center frequency of said digital voltage controlled oscillator in said initial training mode are initially adjusted based upon frequency analyzed through spectrum analysis of an output of said bandpass filter.

13. An adaptive phase lock system according to claim 1, wherein the input signal is divided into a plurality of time sequential frames and said initial training mode is carried out for each frame.

14. An adaptive phase lock loop system according to claim 1, wherein said normal operation mode is switched to said initial training mode, when an unlocked condition occurs during said normal operation mode.

15. An adaptive phase lock loop system according to claim 8, wherein at least one of center frequency and bandwidth of said bandpass filter is adjusted according to the center frequency of said digital voltage controlled oscillator in both of said initial training mode and said normal operation mode.

16. An adaptive phase lock loop system according to claim 10, wherein a carrier frequency component of the input signal resides in a band in which an output of a related bandpass filter has a most at a beginning time of the initial training mode.

17. An adaptive phase lock loop system according to claim 1, wherein said initial phase difference calculator provides an average value in a block of the output of said loop filter as an intial phase error for a first duration in said initial training mode, and said center frequency difference calculator provides an average value in a block of output of said loop filter for a second duration which follows said first duration.

18. An adaptive phase lock loop system according to claim 17, wherein said initial phase difference calculator provides an average value of the output of said loop filter for 1-10 samplings after kick-off as an initial phase error and said center frequency difference calculator provides an average value of output level of said loop filter for 30-40 samples as a center frequency error.

19. An adaptive phase lock loop system according to claim 1, wherein said center frequency difference calculator provides an average value in a block of output of said loop filter for a duration after kick-off and said initial phase difference calculator provides an initial phase error calculated by using the center frequency, a center frequency error and the output of said accumulator for said duration.

20. An adaptive phase lock loop system according to claim 1, wherein the center frequency of said center frequency generator is set by a predetermined value or a value given by a spectrum analyzer.

21. An adaptive phase lock loop system according to claim 1, wherein said center frequency generator and said initial phase generator provide DC level outputs corresponding to frequency and phase, respectively.

* * * * *